Figure 1:
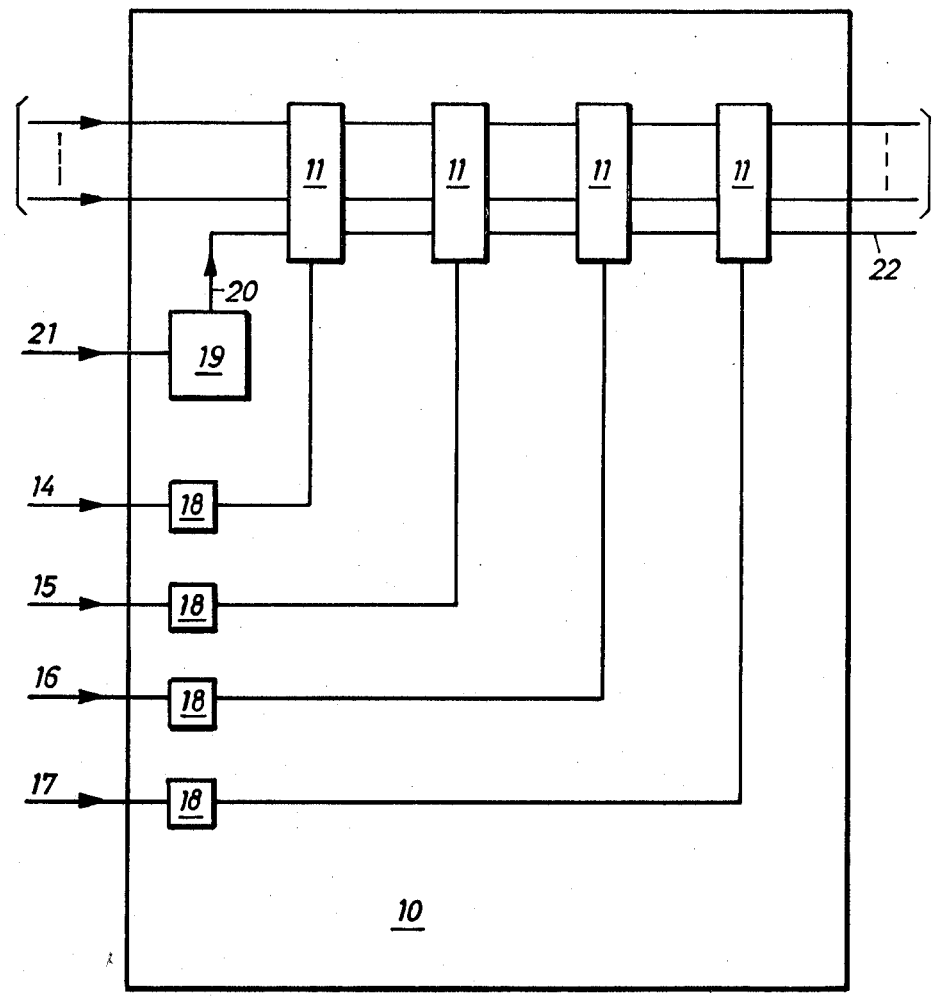

United States Patent [19]

Pehrson et al.

[11] 4,081,662
[45] Mar. 28, 1978

[54] CLOCK SUPERVISION IN DIGITAL SYSTEMS

[75] Inventors: Jens Erland Pehrson, Sollentuna; Sture Gösta Roos, Bergshamra; Bartolo Valastro, Skarholmen, all of Sweden

[73] Assignee: Telefonaktiebolaget L M Ericsson, Stockholm, Sweden

[21] Appl. No.: 722,673

[22] Filed: Mar. 28, 1978

[30] Foreign Application Priority Data

Sep. 29, 1975 Australia .................. 3364/75

[51] Int. Cl.² .......................... G06F 11/00
[52] U.S. Cl. ............................. 235/308
[58] Field of Search ............ 235/153 AP, 153 AC, 235/153 R, 153 A, 308; 340/146.1 R; 324/73 R

[56] References Cited

U.S. PATENT DOCUMENTS

| 3,056,108 | 9/1962 | Heineck | 235/153 AP |
| 3,176,269 | 3/1965 | Croad, Jr. | 235/153 AP |
| 3,659,088 | 4/1972 | Boisvert, Jr. | 235/153 AC |
| 3,761,695 | 9/1973 | Eichelberger | 235/153 AC |
| 3,789,205 | 1/1974 | James | 235/153 AC |
| 3,805,152 | 4/1974 | Ebersman et al. | 324/73 R |
| 3,815,025 | 6/1974 | Jordan | 324/73 R |
| 3,961,252 | 6/1976 | Eicheiberger | 235/153 AC |

*Primary Examiner*—Charles E. Atkinson
*Attorney, Agent, or Firm*—Hane, Roberts, Spiecens & Cohen

[57] ABSTRACT

A method for the supervision of clock signals in a digital data system in which data is clocked progressively by clock signals through a number of registers includes supervisory flip flops associated with each register with a clock supervision bit progressively clocked through the flip flops which together from a supervision chain. The absence of one or more of the clock signals prevents the clock supervision bit from propagating to the end of the chain. By monitoring said clock supervision bit after propagation through the supervision chain it can be determined whether clock signals are supplied correctly to all registers.

5 Claims, 2 Drawing Figures

CLOCK SUPERVISION IN DIGITAL SYSTEMS

The present invention relates to a method for the supervision of clock signals in a digital data system having one or more registers through which data is progressively clocked by the clock signals.

In digital systems such as digital data switches, certain problems exist relating to the supervision of distributed clock pulses of the system. For example, the data being transferred through reclocking shift registers of the system may have an accompanying parity bit. Parity checkers between registers will certainly detect hardward faults providing these faults cause parity errors. However, the parity checkers will not detect the failure of clocks which feed signals to the various registers, that is, if any of the clocks stop, no new data will be clocked through the register controlled by the failed clock. This, however, will not result in parity errors since the old data which remains in the register will have correct parity.

In order to supervise this type of failure, a number of possibilities exist and have been used in the past. These together with their limitations are discussed below.

SUPERVISION BY THROUGH CONNECTION TEST

The through conection test is a very general test which is performed in digital data switches. The test is performed at the start of a connection and involves the sending of a specific pattern, or any data pattern with incorrect parity through the switch. A check is made at the appropriate switch outlet to see that the expected through connection test word pattern or parity violated pattern is received. Failure of a through connection test normally means that a path through the switch has not been correctly established.

A large number of fault types including clock failure could cause failure of the through connection test.

The intrinsic problems with this type of test are:
(i) It is difficult to specify the fault type and fault location.
(ii) A long time may elapse before a fault is detected since the through connection test frequency is traffic dependent. Of course this test could be performed at a rate independent of the traffic load but this may cause overloading of the processors.

SUPERVISION BY HAVING "WATCH DOGS" ON CLOCKS

This system of clock supervision relies on having monostable circuits associated with each clock buffer output on each printed circuit card within the digital system. In other words, each of the clocks feeding a register on a card via a buffer also feeds a monstable circuit. The monostable circuit operates in such a way that if it fails to receive clock signals within a specified time it will revert to its stable state and generate a fault flag. These flags can then be scanned in a routine manner by a regional processor. Hence there is a quick indication of the fault type and its locality. This system is quite good in as much as it is possible to quickly diagnose clock failures and point to the specific location of the fault. It does, however, have the disadvantage of requiring a considerable amount of logic to enable effective supervision and does not supervise clock buffers internal to the reclocking register.

INDIRECT SUPERVISION THROUGH PARITY

Yet another known method of supervising clock faults is to arrange the circuits in such a way as to ensure that any clock fault would generate parity erros. Usually a reclocking register is physically made up of more than one integrated circuit, for example, two hex D flip flop integrated circuits would be used to make up an 11 bit wide reclocking register. The arrangement then is to feed these two integrated circuits from separately buffered clocks. Hence in the event of failure of one of the clock buffers, parity errors would occur because one of the reclocking register halves would not transmit through new data whereas the other half would. The parity flag is routinely scanned by a regional processor hence a quick indication of the fault is obtained.

The disadvantages of this arrangement are:
(i) The fault indication does not directly point to a clock fault and more analysis would have to be performed in order to establish the fault type.
(ii) The number of clock buffers required would need to be greatly increased in order to supply two independent clocks to a register.

It is therefore an object of the present invention to provide an improved method and apparatus for supervision of clock signals in digital systems, which avoids the abovementioned disadvantages.

In the invention this is achieved in such a manner that a clock supervision bit is clocked through supervision flip flops each associated with a register and together forming a supervision chain under control of the supervised clocks such that the absence of one or more of the clock signals prevents the clock supervision bit from propagating to the end of such supervision chain, and monitoring and clock supervision bit after propagation through the supervision chain to determine whether or not is has propagated through the supervision chain.

Figure 2:
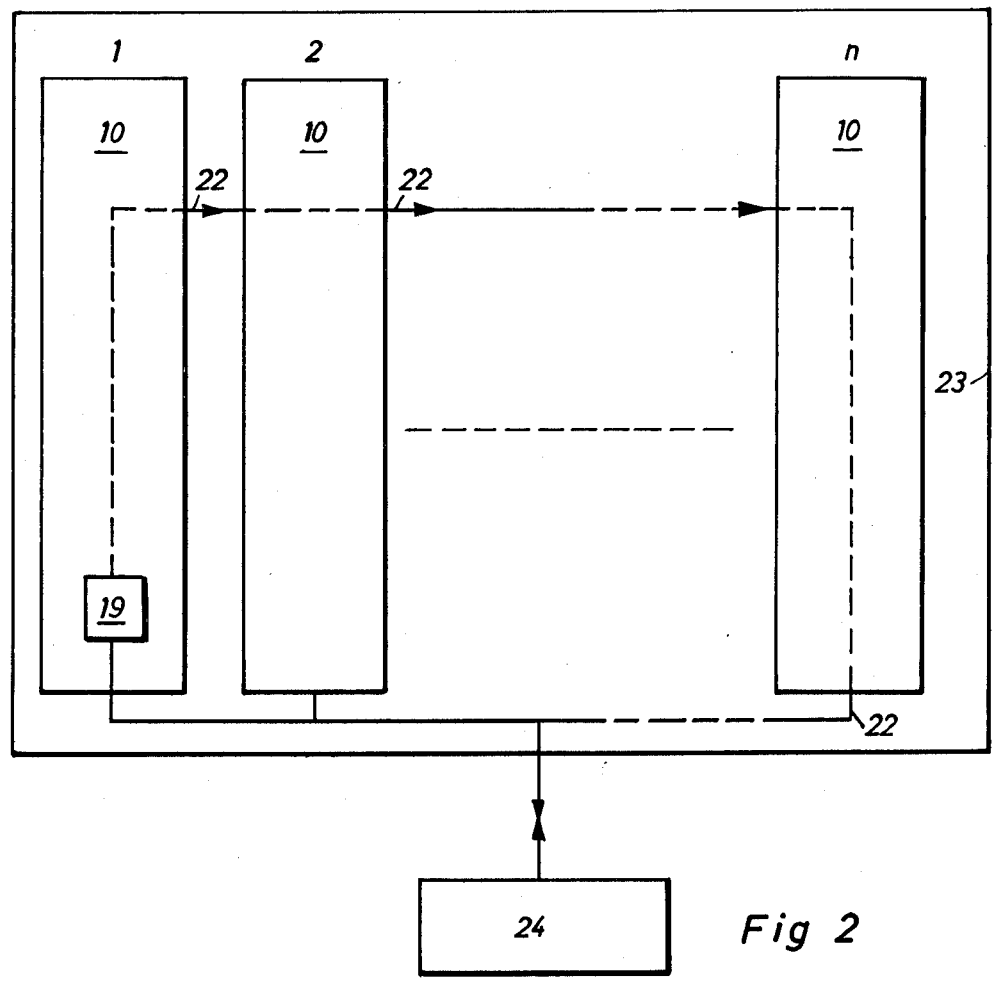

In order that the invention may be more readily understood one particular embodiment will now be described with reference to the accompanying drawings wherein:

FIG. 1 is a diagramatic representation of the relevant parts of a printed circuit card of a digital system incorporating the embodiment of the invention; and FIG. 2 is a diagramatic representation showing a plurality of printed circuit cards according to FIG. 1 which together make up a portion of a system.

In FIG. 1 the circuit card 10 is shown to include a series of reclocking registers 11 which clock data on incoming data lines I through to outgoing data lines O. A separate clock is provided for each register 11 on the respective clock inputs 14 to 17. Each clock is fed to its respective register 11 via an individual clock buffer 18.

In most cases, commercially available registers which make up the reclocking registers 11 do not provide for the exact number of bits which are to be reclocked and spare bits exist in the reclocking registers. The present invention takes advantage of this fact although it should be realized that spare bits may not always be available and in some cases it may be necesary to design the registers 11 with redundancy in order to provide an extra bit for incorporation of the invention. It is of course possible to realize the invention by means of a flip flop arranged separately from the register and controlled by the supervised clock.

This embodiment of the invention consists essentially of the inclusion of a clock supervision bit latch 19 on the card 10 to provide a clock supervision bit on connection 20. The clock supervision bit latch 19 is controlled by a control signal on connection 21 from a regional processor (not shown). The clock supervision bit on connection 20 is adapted for connection through all the registers 11 as shown and may appear at the output from the card on connection 22. Each register 11 includes a supervision flip flop which may consist of one of the register stages and to one input of which the supervision bit is supplied. Upon receiving a signal from the clock connected to the register, the supervision flip flop is set and sends the supervision bit to the subsequent register. This is carried out continuously through the whole register group.

FIG. 2 shows a digital system block 23, a portion of a digital system, comprising a plurality of cards 10 which are illustrated as Card 1, ... Card n. The block 23 is under the control of a regional processor 24 and card 1 has a clock supervision bit latch 19 as described above. The clock supervision bit appearing on output 22 from card 1 is fed to card 2 where it is connected through all the reclocking registers as described above with reference to FIG. 1. Similarly, the clock supervision bit is fed serially to all other cards in the block 23 and the output of the last Card (Card n) is returned to the regional processor 24.

The method of operation is such that the regional processor 24 controls the clock supervision bit latch 19 so as to set its output to logical one. Providing there is no clock fault, this bit will propagate through card 1 and all other cards in the block 23. The regional processor having allowed sufficient time for the clock supervision bit to propagate through the block then examines this bit at the output of the last reclocking stage of the last card (Card n). If the bit is logical one the regional processor 24 knows that all the clock phases were present. The regional processor then sets the output of the clock supervision bit latch to zero and checks to see that the zero correctly propagates through the block 23. This process is continuously repeated. If the clock supervision bit does not propagate through the block the regional processor can then monitor the state of the bit at the output of each card of the block thus enabling localization of the fault to one card. This localization to one card is envisaged to be sufficient. However, it should be obvious that further localizaton to locate a particular clock phase on a particular board is possible with this method of supervision. It should be noted that the normal data flow passing through the registers is supervised in conventional manner, for example by parity check independently of the above-described method for clock signal supervision.

The advantage that this method of supervision has over the "watchdog" method previously described, is that it enables a considerable reduction in hardware. One reason for this is that in using a reclocking register it is often the case that there are one or more spare bits in the register which can be used for the reclocking of the clock supervision bit. If the "watchdog" method were used, a monostable circuit would have to be used in spite of there being spare bits in registers. It would also be necessary to perform a logical OR function on the monostable outputs in order to provide a master error flag to avoid scanning of each clock error flag individually when there are no clock errors. This logical OR functon is automatically available with the invention without the requirement of any additional logic.

Furthermore, the present invention also supervises the clock buffers internal to the reclocking registers. Of course there are some cases when a register does not have a spare bit or where the clock to be supervised is not used for reclocking purposes. In these cases additional flip flops must be provided in order to sequence (clock through) the clock supervision bit with these phases.

The basic advantage of this invention over prior art solutions is that it enables a very fast detection and precise location of clock faults without requiring anywhere near as much additional logic as would be required with prior art solutions to the problem.

We claim:

1. A method for the supervision of clock signals in a digital data system having registers through which data is progressively clocked by such clock signals, said method comprising the steps of providing a supervising flip-flop for each one of the registers and arranging said flip-flops to form a supervision chain, generating at least one clock supervision bit, supplying said clock supervision bit to the first flip-flop in the supervision chain so as to change the binary condition of said first flip-flop, supplying a unit of binary information concerning the state of each flip-flop in the supervision chain to the subsequent flip-flop of the supervision chain, changing the binary state of each flip-flop in dependence of the binary-state-change information from the previous flip-flop in the supervision chain, and monitoring the binary condition of the last flip-flop of the supervision chain so as to determine whether said clock supervision bit has propagated through the whole supervision chain of flip-flops which occurs when all clock signals have been supplied correctly to each of the registers because the absence of one or more clock signals prevents said clock supervision bit from propagating through the supervision chain.

2. A method according to claim 1, wherein said clock supervision bit is inverted after successful propagation through said supervision chain and again progressively clocked therethrough and again monitored after propagation, said supervision bit being inverted after each propagation in a repeating manner until a fault is detected.

3. A method according to claim 1, wherein said clock supervision bit is monitored at varius stages along said supervision chain in the case of a fault being detected, in order to localize the position of said fault.

4. A method according to claim 1, wherein said flip-flops utilize idle positions in the register without influencing or being influenced by the normal functions of the registers.

5. A method according to claim 1, wherein the supervising flip-flops are independent units separated from the registers but controlled by the register clock signals.

* * * * *